(12) United States Patent
Golko et al.

(10) Patent No.: US 8,882,524 B2
(45) Date of Patent: Nov. 11, 2014

(54) EXTERNAL CONTACT PLUG CONNECTOR

(75) Inventors: Albert J. Golko, Saratoga, CA (US);
Arthur Stanley Brigham, Sunnyvale, CA (US); Anwyl Myron McDonald, Oakland, CA (US); Daniel Zisuk Lee, Queensbury, NY (US); Troy Alexander Carter, Sunnyvale, CA (US); Jose A. Marin, New Orleans, LA (US); Paul Bongkyu Koh, New York, NY (US)

(73) Assignee: Apple Inc., Cupertino, CA (US)

( * ) Notice: Subject to any disclaimer, the term of this patent is extended or adjusted under 35 U.S.C. 154(b) by 47 days.

(21) Appl. No.: 13/704,234

(22) PCT Filed: Jun. 21, 2011

(86) PCT No.: PCT/US2011/041286
§ 371 (c)(1),
(2), (4) Date: Dec. 13, 2012

(87) PCT Pub. No.: WO2011/163256
PCT Pub. Date: Dec. 29, 2011

(65) Prior Publication Data
US 2013/0095702 A1    Apr. 18, 2013

Related U.S. Application Data

(60) Provisional application No. 61/357,026, filed on Jun. 21, 2010.

(51) Int. Cl.
*H01R 27/00* (2006.01)
(Continued)

(52) U.S. Cl.
CPC .......... *H01R 13/055* (2013.01); *H01R 13/6273* (2013.01); *H01R 27/00* (2013.01); *H01R 29/00* (2013.01); *H01R 13/035* (2013.01); *H01R 13/24* (2013.01); *H01R 13/6275* (2013.01); *H01R 13/642* (2013.01); *H01R 13/6582* (2013.01); *H01R 13/6683* (2013.01); *H01R 2201/06* (2013.01); *H05K 1/117* (2013.01)

USPC .......................................................... 439/218

(58) Field of Classification Search
USPC .......................................................... 439/218
See application file for complete search history.

(56) References Cited

U.S. PATENT DOCUMENTS 2,792,557 A   5/1957   Dowick
2,892,990 A   6/1959   Werndl
(Continued)

FOREIGN PATENT DOCUMENTS

CN   1397804       2/2003
CN   1830122 A     9/2006
(Continued)

OTHER PUBLICATIONS

Office Action for United Kingdom Patent Application No. 1220045.7, mailed on Mar. 7, 2014, 3 pages.
(Continued)

*Primary Examiner* — Ross Gushi
(74) *Attorney, Agent, or Firm* — Kilpatrick Townsend & Stockton LLP

(57) ABSTRACT

A dual orientation plug connector having a connector tab with first and second major opposing sides and a plurality of electrical contacts carried by the connector tab. The plurality of contacts may include a first set of external contacts formed at the first major side and a second set of external contacts formed at the second major side. The first plurality of contacts may be symmetrically spaced with the second plurality of contacts and the connector tab may be shaped to have 180 degree symmetry so that it can be inserted and operatively coupled to a corresponding receptacle connector in either of two insertion orientations. A receptacle connector corresponding to the plug connector.

24 Claims, 8 Drawing Sheets

(51) Int. Cl.
  *H01R 13/05* (2006.01)
  *H01R 13/627* (2006.01)
  *H01R 29/00* (2006.01)
  *H01R 13/03* (2006.01)
  *H01R 13/24* (2006.01)
  *H01R 13/642* (2006.01)
  *H01R 13/6582* (2011.01)
  *H01R 13/66* (2006.01)
  *H05K 1/11* (2006.01)

(56) References Cited

U.S. PATENT DOCUMENTS

| | | | |
|---|---|---|---|
| 3,760,335 A | 9/1973 | Roberts | |
| 3,793,614 A | 2/1974 | Tachick et al. | |
| 3,795,037 A | 3/1974 | Luttmer | |
| 4,361,375 A | 11/1982 | Bailey et al. | |
| 4,558,912 A | 12/1985 | Coller et al. | |
| 4,621,882 A | 11/1986 | Krumme | |
| 4,711,506 A | 12/1987 | Tanaka | |
| 5,040,994 A | 8/1991 | Nakamoto et al. | |
| 5,256,074 A | 10/1993 | Tan | |
| 5,295,843 A * | 3/1994 | Davis et al. | 439/108 |
| 5,380,225 A | 1/1995 | Inaoka | |
| 5,387,110 A | 2/1995 | Kantner et al. | |
| 5,442,243 A * | 8/1995 | Bailey | 307/10.5 |
| 5,554,042 A | 9/1996 | Denninger | |
| 5,594,284 A | 1/1997 | Hill et al. | |
| 5,785,557 A | 7/1998 | Davis | |
| 5,959,848 A | 9/1999 | Groves et al. | |
| 5,967,833 A | 10/1999 | Cachina | |
| 6,074,225 A | 6/2000 | Wu et al. | |
| 6,086,421 A | 7/2000 | Wu et al. | |
| 6,113,427 A | 9/2000 | Wu | |
| 6,179,627 B1 | 1/2001 | Daly et al. | |
| 6,231,396 B1 | 5/2001 | Huang | |
| 6,322,394 B1 | 11/2001 | Katoh et al. | |
| 6,364,699 B1 | 4/2002 | Hwang et al. | |
| 6,410,857 B1 | 6/2002 | Gonya | |
| 6,482,028 B2 * | 11/2002 | Kumamoto et al. | 439/498 |
| 6,482,045 B2 | 11/2002 | Arai | |
| 6,530,793 B2 * | 3/2003 | Eichhorn et al. | 439/218 |
| 6,692,311 B1 | 2/2004 | Kamei et al. | |
| 6,786,763 B2 | 9/2004 | Wu | |
| 6,846,202 B1 | 1/2005 | Schmidt et al. | |
| 6,869,320 B2 | 3/2005 | Haas et al. | |
| 6,902,432 B2 | 6/2005 | Morikawa et al. | |
| 6,948,965 B2 | 9/2005 | Kumamoto et al. | |
| 6,948,983 B1 | 9/2005 | Peng | |
| 6,948,984 B2 * | 9/2005 | Chen et al. | 439/660 |
| 6,962,510 B1 * | 11/2005 | Chen et al. | 439/660 |
| 6,964,582 B2 | 11/2005 | Zhuang et al. | |
| 6,981,887 B1 * | 1/2006 | Mese et al. | 439/244 |
| 7,021,971 B2 | 4/2006 | Chou et al. | |
| 7,040,919 B2 | 5/2006 | Yao | |
| 7,074,052 B1 | 7/2006 | Ni et al. | |
| 7,094,086 B2 * | 8/2006 | Teicher | 439/173 |
| 7,094,089 B2 * | 8/2006 | Andre et al. | 439/218 |
| 7,160,125 B1 * | 1/2007 | Teicher | 439/173 |
| 7,175,444 B2 | 2/2007 | Lang et al. | |
| 7,198,522 B1 | 4/2007 | Ho et al. | |
| 7,249,978 B1 | 7/2007 | Ni | |
| 7,361,059 B2 * | 4/2008 | Harkabi et al. | 439/660 |
| 7,363,947 B2 * | 4/2008 | Teicher | 139/173 |
| 7,364,445 B1 | 4/2008 | Ni et al. | |
| 7,387,539 B2 * | 6/2008 | Trenne | 439/660 |
| 7,396,257 B2 | 7/2008 | Takahashi | |
| 7,407,416 B1 | 8/2008 | Rogers et al. | |
| 7,435,107 B2 | 10/2008 | Matsumoto et al. | |
| 7,440,286 B2 | 10/2008 | Hiew et al. | |
| 7,442,091 B2 | 10/2008 | Salomon et al. | |
| 7,458,825 B2 | 12/2008 | Atsmon et al. | |
| 7,500,861 B2 * | 3/2009 | Harkabi et al. | 439/218 |
| 7,537,471 B2 * | 5/2009 | Teicher | 439/172 |
| 7,549,896 B2 | 6/2009 | Zhang et al. | |
| 7,553,172 B2 * | 6/2009 | Chiu et al. | 439/131 |
| 7,559,805 B1 | 7/2009 | Yi et al. | |
| 7,572,153 B2 * | 8/2009 | Trenne | 439/660 |
| 7,591,657 B2 * | 9/2009 | Teicher | 439/173 |
| 7,594,827 B2 | 9/2009 | Takamoto et al. | |
| 7,695,318 B1 | 4/2010 | Wang et al. | |
| 7,716,400 B2 | 5/2010 | Raines | |
| 7,717,717 B1 | 5/2010 | Lai | |
| 7,722,409 B2 | 5/2010 | Takamoto et al. | |
| 7,727,027 B2 | 6/2010 | Chiang et al. | |
| 7,740,498 B2 | 6/2010 | Orsley | |
| 7,841,894 B2 | 11/2010 | Gong et al. | |
| 7,872,873 B2 | 1/2011 | Hiew et al. | |
| 7,892,014 B2 | 2/2011 | Amidon et al. | |
| 7,918,685 B1 | 4/2011 | Kruckenberg | |
| 8,007,309 B2 | 8/2011 | Fan | |
| 8,062,073 B1 | 11/2011 | Szczesny et al. | |
| 8,162,696 B2 | 4/2012 | Elbaz et al. | |
| 8,246,388 B2 | 8/2012 | Chen et al. | |
| 8,277,258 B1 | 10/2012 | Huang et al. | |
| 8,282,417 B2 | 10/2012 | Xiao | |
| 8,287,299 B2 | 10/2012 | Ray et al. | |
| 8,461,465 B2 * | 6/2013 | Golko et al. | 174/359 |
| 8,478,913 B2 * | 7/2013 | Terlizzi et al. | 710/62 |
| 8,517,751 B1 * | 8/2013 | Golko et al. | 439/218 |
| 8,517,766 B2 * | 8/2013 | Golko et al. | 439/607.41 |
| 8,535,075 B1 * | 9/2013 | Golko et al. | 439/218 |
| 8,545,269 B2 | 10/2013 | Ore-Yang | |
| 8,561,879 B2 | 10/2013 | Jol et al. | |
| 8,573,995 B2 * | 11/2013 | Golko et al. | 439/218 |
| 8,647,156 B2 * | 2/2014 | Golko et al. | 439/668 |
| 8,686,600 B2 * | 4/2014 | Terlizzi et al. | 307/125 |
| 8,688,876 B1 * | 4/2014 | Fritchman et al. | 710/69 |
| 8,708,745 B2 * | 4/2014 | Golko et al. | 439/607.41 |
| 8,762,605 B2 * | 6/2014 | Terlizzi et al. | 710/62 |
| 8,777,666 B2 | 7/2014 | Golko et al. | |
| 2001/0046809 A1 | 11/2001 | Chiran et al. | |
| 2002/0081880 A1 * | 6/2002 | Eichhorn et al. | 439/218 |
| 2003/0016509 A1 | 1/2003 | Tsukamoto | |
| 2003/0207606 A1 | 11/2003 | Ho | |
| 2004/0229515 A1 | 11/2004 | Kaneda et al. | |
| 2005/0042930 A1 | 2/2005 | Harkabi et al. | |
| 2005/0079738 A1 | 4/2005 | Ahn | |
| 2005/0085136 A1 | 4/2005 | Zhang | |
| 2005/0124217 A1 * | 6/2005 | Zhuang et al. | 439/607 |
| 2005/0124218 A1 * | 6/2005 | Chen et al. | 439/607 |
| 2005/0124219 A1 * | 6/2005 | Chen et al. | 439/607 |
| 2005/0202727 A1 * | 9/2005 | Andre et al. | 439/660 |
| 2006/0019545 A1 | 1/2006 | Moriyama et al. | |
| 2006/0024997 A1 * | 2/2006 | Teicher | 439/217 |
| 2006/0040549 A1 | 2/2006 | Yao | |
| 2006/0148300 A1 | 7/2006 | Huang et al. | |
| 2006/0216991 A1 | 9/2006 | Boutros | |
| 2006/0289201 A1 | 12/2006 | Kim et al. | |
| 2007/0010115 A1 * | 1/2007 | Teicher | 439/173 |
| 2007/0010116 A1 * | 1/2007 | Teicher | 439/173 |
| 2007/0037452 A1 | 2/2007 | Martin et al. | |
| 2007/0049100 A1 | 3/2007 | Tsai | |
| 2007/0072442 A1 | 3/2007 | DiFonzo | |
| 2007/0082701 A1 | 4/2007 | Seil et al. | |
| 2007/0178771 A1 | 8/2007 | Goetz et al. | |
| 2007/0202725 A1 * | 8/2007 | Teicher | 439/173 |
| 2007/0243726 A1 | 10/2007 | Trenne | |
| 2008/0032562 A1 | 2/2008 | McHugh et al. | |
| 2008/0067248 A1 | 3/2008 | Hiew et al. | |
| 2008/0090465 A1 | 4/2008 | Matsumoto et al. | |
| 2008/0119076 A1 * | 5/2008 | Teicher | 439/171 |
| 2008/0119291 A1 | 5/2008 | Takamoto et al. | |
| 2008/0167828 A1 | 7/2008 | Terlizzi et al. | |
| 2008/0274633 A1 | 11/2008 | Teicher | |
| 2008/0309313 A1 | 12/2008 | Farrar et al. | |
| 2009/0004923 A1 | 1/2009 | Tang et al. | |
| 2009/0108848 A1 | 4/2009 | Lundquist | |
| 2009/0117768 A1 | 5/2009 | Liao | |
| 2009/0149049 A1 * | 6/2009 | Harkabi et al. | 439/218 |
| 2009/0156027 A1 | 6/2009 | Chen | |
| 2009/0180243 A1 | 7/2009 | Lynch et al. | |
| 2010/0009575 A1 | 1/2010 | Crooijmans et al. | |
| 2010/0062656 A1 | 3/2010 | Lynch et al. | |

(56) References Cited

U.S. PATENT DOCUMENTS

| | | | |
|---|---|---|---|
| 2010/0104126 A1 | 4/2010 | Greene | |
| 2010/0171465 A1 | 7/2010 | Seal et al. | |
| 2010/0221936 A1 | 9/2010 | Zhao et al. | |
| 2010/0248544 A1 | 9/2010 | Xu et al. | |
| 2010/0254602 A1 | 10/2010 | Yoshino | |
| 2010/0254662 A1 | 10/2010 | He et al. | |
| 2010/0267261 A1 | 10/2010 | Lin et al. | |
| 2010/0267262 A1 | 10/2010 | Lin et al. | |
| 2011/0136381 A1 | 6/2011 | Cho | |
| 2011/0159719 A1 | 6/2011 | Takahashi et al. | |
| 2011/0201213 A1 | 8/2011 | Dabov et al. | |
| 2011/0250786 A1 | 10/2011 | Reid | |
| 2011/0294354 A1 | 12/2011 | Chen et al. | |
| 2011/0312200 A1 | 12/2011 | Wang et al. | |
| 2012/0028495 A1 | 2/2012 | Su et al. | |
| 2013/0075149 A1 | 3/2013 | Golko et al. | |
| 2013/0078869 A1 | 3/2013 | Golko et al. | |
| 2013/0089291 A1* | 4/2013 | Jol et al. | 385/77 |
| 2013/0095701 A1* | 4/2013 | Golko et al. | 439/660 |
| 2013/0095702 A1* | 4/2013 | Golko et al. | 439/676 |
| 2013/0115821 A1* | 5/2013 | Golko et al. | 439/638 |
| 2013/0117470 A1* | 5/2013 | Terlizzi et al. | 710/3 |
| 2013/0122754 A1* | 5/2013 | Golko et al. | 439/676 |
| 2013/0149911 A1* | 6/2013 | Golko et al. | 439/668 |
| 2013/0217253 A1* | 8/2013 | Golko et al. | 439/345 |
| 2013/0244489 A1* | 9/2013 | Terlizzi et al. | 439/620.01 |
| 2013/0244491 A1* | 9/2013 | Sarwar et al. | 439/655 |
| 2013/0244492 A1* | 9/2013 | Golko et al. | 439/660 |
| 2014/0004741 A1* | 1/2014 | Jol et al. | 439/620.01 |
| 2014/0068933 A1 | 3/2014 | Brickner et al. | |
| 2014/0069709 A1 | 3/2014 | Schmidt et al. | |
| 2014/0073170 A1* | 3/2014 | Golko et al. | 439/350 |
| 2014/0073183 A1* | 3/2014 | Golko et al. | 439/607.34 |
| 2014/0073193 A1 | 3/2014 | SooHoo et al. | |
| 2014/0170907 A1* | 6/2014 | Golko et al. | 439/676 |
| 2014/0206209 A1 | 7/2014 | Kamei et al. | |

FOREIGN PATENT DOCUMENTS

| | | |
|---|---|---|
| CN | 201402871 Y | 2/2010 |
| CN | 101783466 A | 7/2010 |
| CN | 201533091 U | 7/2010 |
| DE | 196 09 571 A1 | 11/1995 |
| DE | 20 2004 021354 U1 | 9/2007 |
| EP | 81372 A2 | 6/1983 |
| EP | 1684391 A2 | 7/2006 |
| EP | 1717910 A2 | 11/2006 |
| EP | 2169774 A1 | 3/2010 |
| EP | 2 373 131 A1 | 10/2011 |
| FR | 2138961 | 1/1973 |
| JP | 2 078171 | 3/1990 |
| JP | 8321360 A | 12/1996 |
| JP | 2003-217728 | 7/2003 |
| JP | 2004-079491 | 3/2004 |
| TW | M318831 U | 9/2007 |
| TW | M350153 U | 2/2009 |
| WO | 2004/097995 A1 | 11/2004 |
| WO | 2005/013436 A1 | 2/2005 |
| WO | 2005124932 A2 | 12/2005 |
| WO | 2006/013553 A2 | 2/2006 |
| WO | 2006/074348 A1 | 12/2006 |
| WO | 2008/065659 A2 | 6/2008 |
| WO | 2009/069969 A2 | 6/2009 |
| WO | 2009/140992 A1 | 11/2009 |
| WO | 2011043488 A1 | 4/2011 |
| WO | 2011150403 A1 | 12/2011 |
| WO | 2011163256 A1 | 12/2011 |
| WO | 2013070767 A1 | 5/2013 |
| WO | 2013082175 A2 | 6/2013 |

OTHER PUBLICATIONS

Office Action for Russian Application No. 2012157740, mailed Mar. 21, 2014, 5 pages.

Partial Search Report for International PCT Application No. PCT/US2014/012535 (mailed with Invitation to Pay Fees), mailed Apr. 4, 2014, 7 pages.

Non-Final Office Action for U.S. Appl. No. 13/700,441, mailed Apr. 10, 2014, 36 pages.

Office Action for Australian Application No. 2012245184, mailed Apr. 28, 2014, 3 pages.

Office Action for Korean Patent Application No. 10-2012-7034333, mailed Apr. 29, 2014, 6 pages.

Office Action for Taiwanese Patent Application No. 100121725, mailed May 1, 2014, 8 pages.

Office Action, Canadian Patent Application No. 2,800,738, mailed May 8, 2014, 2 pages.

Non-Final Office Action for U.S. Appl. No. 13/703,893, mailed May 9, 2014, 10 pages.

Non-Final Office Action for U.S. Appl. No. 13/704,236, mailed May 19, 2014, 10 pages.

International Preliminary Report on Patentability for International PCT Application No. PCT/US2011/041286, mailed Jan. 10, 2013, 12 pages.

First Office Action, Australian Patent Application No. 2012101657; Mailed Dec. 14, 2012, 4 pages.

International Preliminary Report on Patentability for International PCT Application No. PCT/US2011/038452, mailed Dec. 13, 2012, 19 pages.

International Preliminary Report on Patentability for International PCT Application No. PCT/US2011/041127, mailed Jan. 3, 2013, 8 pages.

International Preliminary Report on Patentability for International PCT Application No. PCT/US2011/041290, mailed Jan. 10, 2013, 15 pages.

International Search Report and Written Opinion for International PCT Application No. PCT/CN2012/081257, mailed on Jun. 20, 2013, 11 pages.

International Search Report and Written Opinion for International PCT Application No. PCT/US2012/063944, mailed Apr. 18, 2013, 23 pages.

Non-Final Office Action for U.S. Appl. No. 13/679,991, mailed Apr. 5, 2013, 19 pages.

Non-Final Office Action for U.S. Appl. No. 13/679,992, mailed Apr. 9, 2013, 18 pages.

Notice of Allowance for U.S. Appl. No. 13/679,992, mailed Jun. 11, 2013, 17 pages.

Notice of Allowance for U.S. Appl. No. 13/679,991, mailed Jul. 10, 2013, 22 pages.

Notice of Allowance for U.S. Appl. No. 13/679,996, mailed Apr. 12, 2013, 30 pages.

Notice of Allowance for U.S. Appl. No. 13/720,822, mailed Apr. 8, 2013, 30 pages.

Partial Search Report for International PCT Application No. PCT/US2012/063944 (mailed with Invitation to Pay Fees), mailed Feb. 20, 2013, 59 pages.

Partial Search Report for International PCT Application No. PCT/US2012/066881 (mailed with Invitation to Pay Fees), mailed Mar. 25, 2013, 8 pages.

Partial Search Report, EP App. No. 12191619.1, Mailed Feb. 20, 2013, 6 pages.

Search and Examination Report for United Kingdom Patent Application No. 1220045.7, mailed on Mar. 15, 2013, 7 pages.

Written Opinion for International PCT Application No. PCT/US2011/038452, mailed on Oct. 26, 2011, 17 pages.

Non-Final Office Action for U.S. Appl. No. 13/607,366, mailed Jul. 11, 2013, 23 pages.

Ex Parte Quayle Office Action for U.S. Appl. No. 13/761,001, mailed Jul. 17, 2013, 10 pages.

International Search Report and Written Opinion for International PCT Application No. PCT/US2013/038008, mailed Aug. 15, 2013, 12 pages.

Notice of Allowance for U.S. Appl. No. 13/761,001, mailed Sep. 10, 2013, 9 pages.

International Search Report and Written Opinion for International PCT Application No. PCT/US2012/066881, mailed Sep. 9, 2013, 19 pages.

(56) References Cited

OTHER PUBLICATIONS

Flipper Press Release (Jun. 25, 2012) and Data Sheet: http://www.flipperusb.com/images/flipperUSB-brochure.pdf, http://www.flipperusb.com/images/flipperUSB-brochure.pdf.
International Search Report for International PCT Application No. PCT/US2011/038452, mailed on Oct. 26, 2011, 7 pages
International Search Report and Written Opinion for International PCT Application No. PCT/US2011/041286, mailed on Oct. 20, 2011, 18 pages.
International Search Report and Written Opinion for International PCT Application No. PCT/US2011/041127, mailed on Dec. 29, 2011, 17 pages.
International Search Report and Written Opinion for International PCT Application No. PCT/US2011/041290, mailed on Nov. 21, 2011, 21 pages.
Office Action for Australian Application No. 2012245184, mailed Nov. 6, 2013, 3 pages.
Non-Final Office Action for U.S. Appl. No. 13/607,566, mailed Dec. 6, 2013, 20 pages.
Office Action for Australian Application No. 2011257975, mailed Dec. 16, 2013, 6 pages.
Extended European Search Report, EP App. No. 13165892.4, mailed Dec. 20, 2013, 6 pages.
Office Action for Korean Patent Application No. 10-2012-0125751, mailed Jan. 22, 2014, 6 pages.
Office Action for Mexican Patent Application No. MX/a/2012/013857, mailed Feb. 6, 2014, 3 pages.
Office Action, Canadian Patent Application No. 2,794,906; Mailed Mar. 4, 2014, 2 pages.
Notice of Allowance for U.S. Appl. No. 13/607,566, mailed Mar. 11, 2014, 8 pages.
Extended European Search Report, EP App. No. 14152776.2, mailed Mar. 11, 2014, 9 pages.
Office Action for United Kingdom Application No. 1400243.0, mailed Mar. 12, 2014, 4 pages.
Office Action for Malaysian Patent Application No. PI2012005119, mailed on May 15, 2014, 4 pages.
International Preliminary Report on Patentability for International PCT Application No. PCT/US2012/063944, mailed May 22, 2014, 15 pages.
International Preliminary Report on Patentability for International PCT Application No. PCT/US2012/054318, mailed Jun. 12, 2014, 8 pages.
International Search Report and Written Opinion for International PCT Application No. PCT/US2012/066881, mailed Jun. 12, 2014, 14 pages.
International Search Report and Written Opinion for International PCT Application No. PCT/US2012/054318, mailed on Oct. 25, 2012, 47 pages.
Extended European Search Report, EP App. No. 12191619.1, Mailed Jul. 10, 2013, 13 pages.
International Search Report and Written Opinion for International PCT Application No. PCT/US2013/037233, mailed on Oct. 1, 2013, 14 pages.
Notice of Allowance for U.S. Appl. No. 13/607,366, mailed Oct. 31, 2013, 14 pages.
Office Action and Search Report for Taiwanese Application No. 100118944, mailed Sep. 16, 2013, 24 pages.
European Search Report, EP App. No. 13195854.8, mailed Mar. 12, 2014, 7 pages.
International Preliminary Report on Patentability for International PCT Application No. PCT/US2012/066881, mailed Jun. 12, 2014, 14 pages.
Office Action for Korean Patent Application No. 10-2013-7001302, mailed Jun. 13, 2014, 9 pages.
Non-Final Office Action for U.S. Appl. No. 13/704,234, mailed Jul. 11, 2014, 6 pages.
Office Action for Chinese Patent Application No. 201310711187.1, mailed Jul. 14, 2014, 5 pages.
Office Action for Mexican Patent Application No. MX/a/2012/013857, mailed Jul. 23, 2014, 4 pages.
Final Office Action for U.S. Appl. No. 13/700,441, mailed Aug. 21, 2014, 9 pages.
Office Action for Australian Application No. 2013204685, mailed Jul. 17, 2014, 2 pages.
Office Action for Korean Patent Application No. 10-2014-0048365, mailed Aug. 11, 2014, 4 pages.
Office Action for Australian Patent Application No. 2013205161, mailed Aug. 18, 2014, 4 pages.
Office Action for Chinese Patent Application No. 201180030576.7, mailed Sep. 2, 2014, 23 pages.
Non-Final Office Action for U.S. Appl. No. 13/610,631, mailed Sep. 16, 2014, 28 pages.
Notice of Allowance for U.S. Appl. No. 13/703,893, mailed Sep. 16, 2014, 8 pages.
Notice of Allowance for U.S. Appl. No. 13/704,236, mailed Sep. 17, 2014, 9 pages.

* cited by examiner

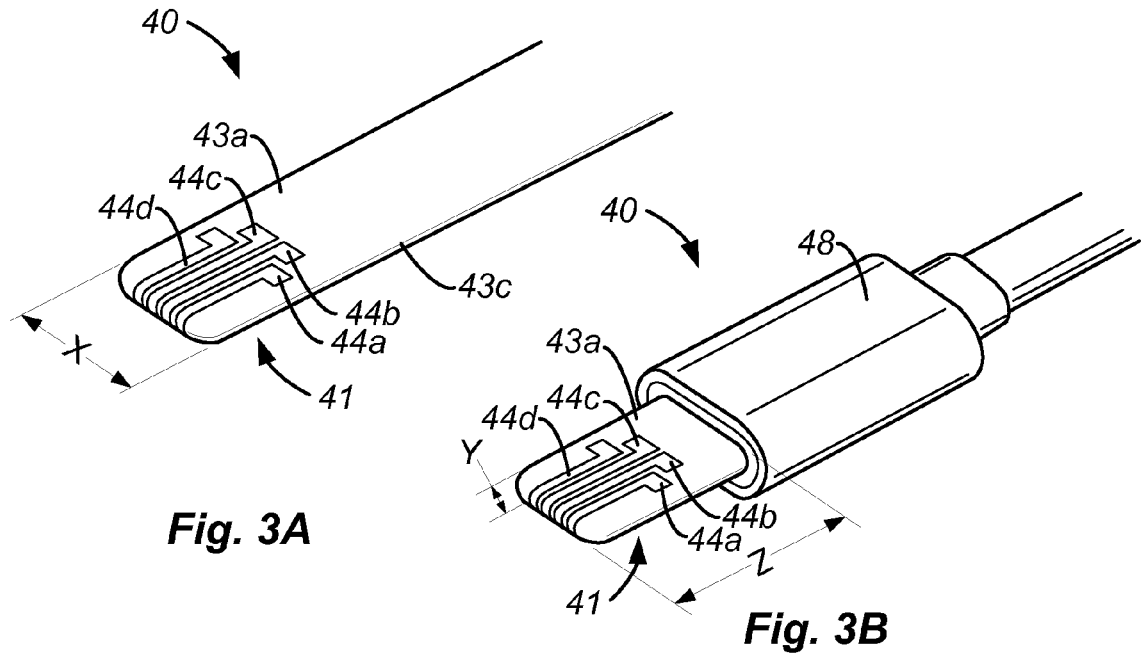
Fig. 3A
Fig. 3B
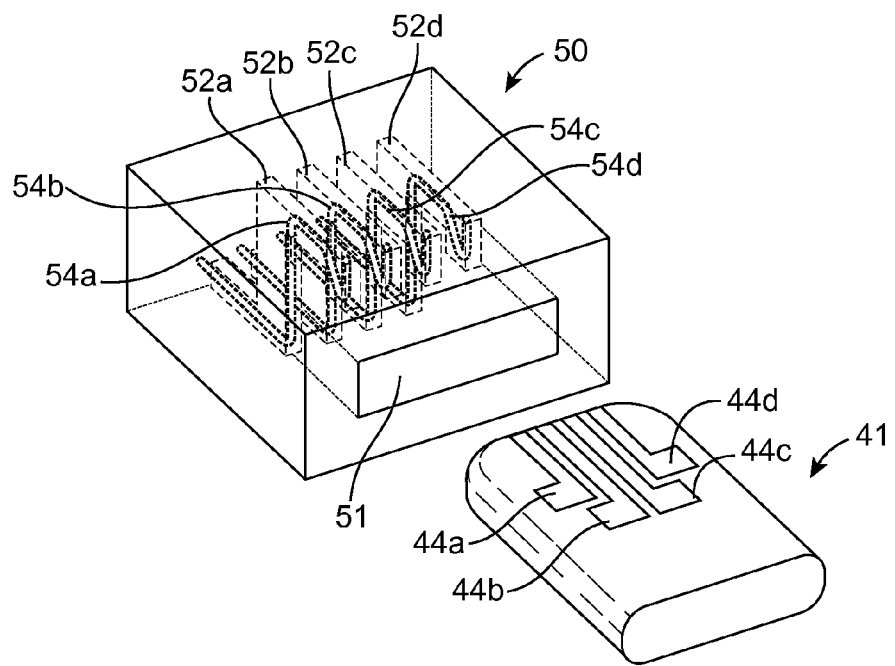
FIG. 4

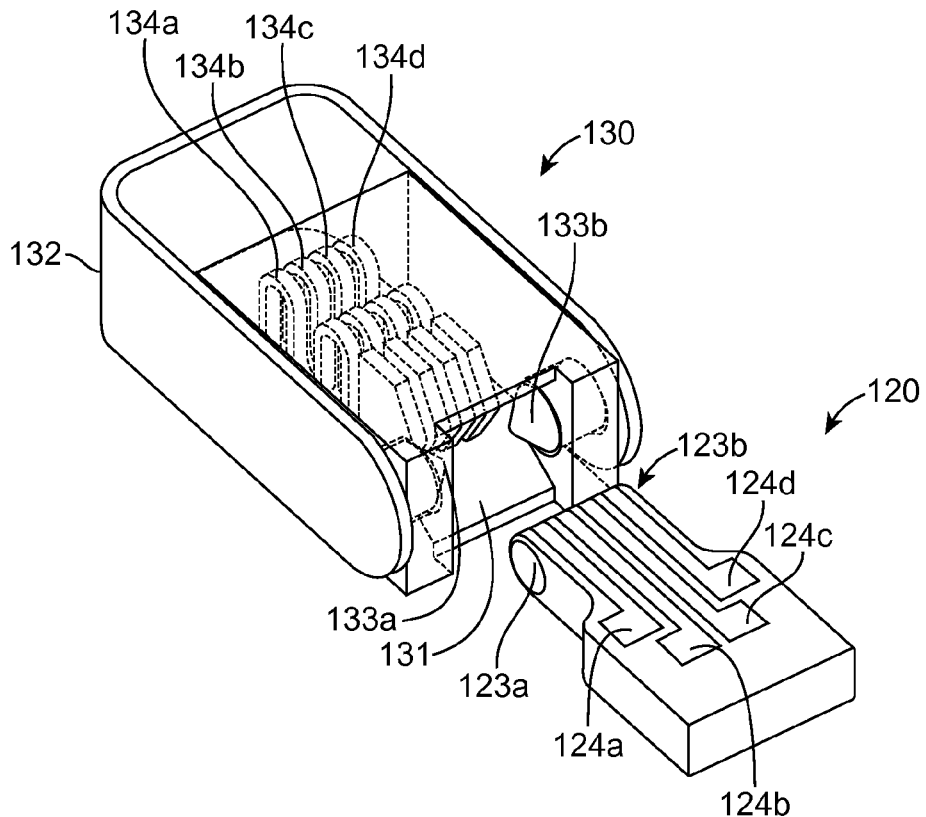
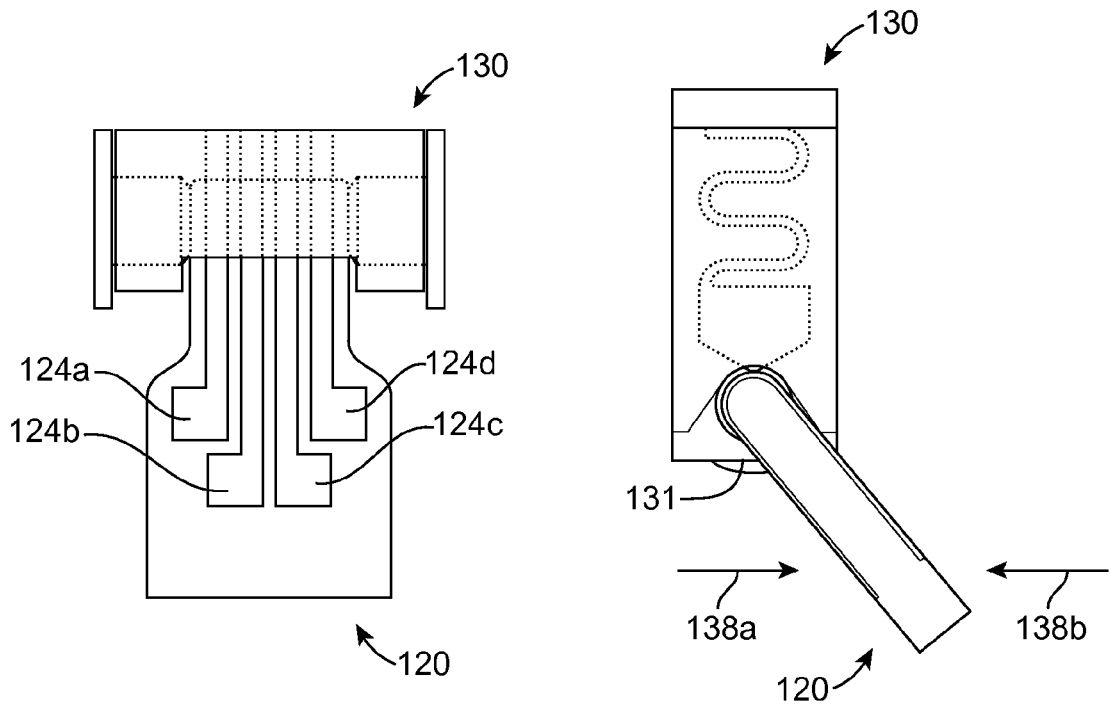
FIG. 8A
FIG. 8B
FIG. 8C

Fig. 9A  Fig. 9B  Fig. 9C
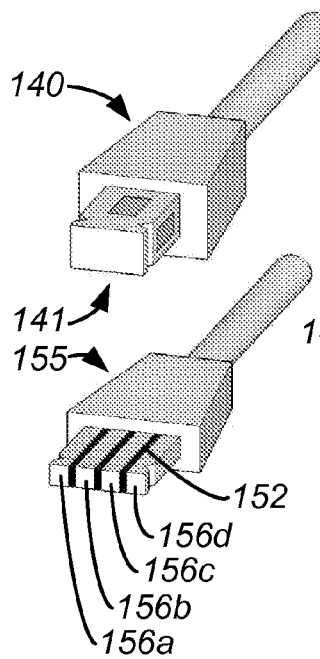
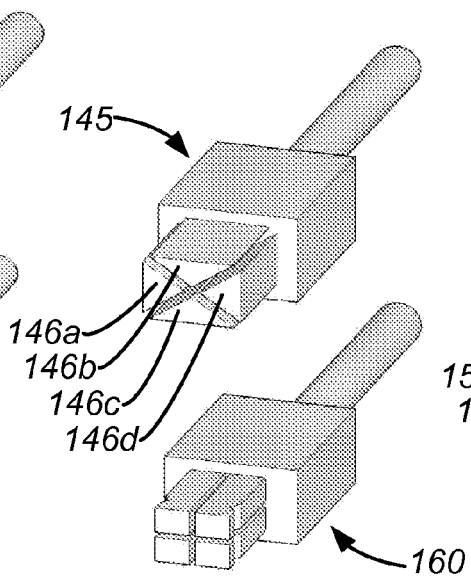
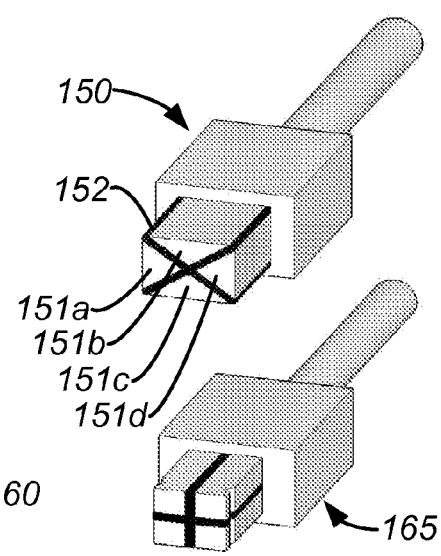
Fig. 9D  Fig. 9E  Fig. 9F

EXTERNAL CONTACT PLUG CONNECTOR

CROSS-REFERENCES TO RELATED APPLICATIONS

This application claims the benefit of U.S. Prov. Pat. App. No. 61/357,026, filed Jun. 21, 2010, and titled "AUDIO CONNECTOR," which is incorporated herein by reference for all purposes.

BACKGROUND OF THE INVENTION

The present invention relates generally to input/output electrical connectors such as audio connectors and data connectors.

Standard audio connectors or plugs are available in three sizes according to the outside diameter of the plug: a 6.35 mm (¼") plug, a 3.5 mm (⅛") miniature plug and a 2.5 mm (3/32") subminiature plug. The plugs include multiple conductive regions that extend along the length of the connectors in distinct portions of the plug such as the tip, sleeve and one or more middle portions between the tip and sleeve resulting in the connectors often being referred to as TRS (tip, ring and sleeve) connectors.

FIGS. 1A and 1B illustrate examples of audio plugs 10 and 20 having three and four conductive portions, respectfully. As shown in FIG. 1A, plug 10 includes a conductive tip 12, a conductive sleeve 16 and a conductive ring 14 electrically isolated from the tip 12 and the sleeve 16 by insulating rings 17 and 18. The three conductive portions 12, 14, 16 are for left and right audio channels and a ground connection. Plug 20, shown in FIG. 1B, includes four conductive portions: a conductive tip 22, a conductive sleeve 26 and two conductive rings 24, 25 and is thus sometimes referred to as a TRRS (tip, ring, ring, sleeve) connector. The four conductive portions are electrically isolated by insulating rings 27, 28 and 29 and are typically used for left and right audio, microphone and ground signals. As evident from FIGS. 1A and 1B, each of audio plugs 10 and 20 are orientation agnostic. That is, the conductive portions completely encircle the connector forming 360 degree contacts such that there is no distinct top, bottom or side to the plug portion of the connectors.

When plugs 10 and 20 are 3.5 mm miniature connectors, the outer diameter of conductive sleeve 16, 26 and conductive rings 14, 24, 25 is 3.5 mm and the insertion length of the connector is 14 mm. For 2.5 mm subminiature connectors, the outer diameter of the conductive sleeve is 2.5 mm and the insertion length of the connector is 11 mm long. Such TRS and TRRS connectors are used in many commercially available MP3 players and smart phones as well as other electronic devices. Electronic devices such as MP3 players and smart phones are continuously being designed to be thinner and smaller and/or to include video displays with screens that are pushed out as close to the outer edge of the devices as possible. The diameter and length of current 3.5 mm and even 2.5 mm audio connectors are limiting factors in making such devices smaller and thinner and in allowing the displays to be larger for a given form factor.

Many standard data connectors are also only available in sizes that are limiting factors in making portable electronic devices smaller. Additionally, and in contrast to the TRS connectors discussed above, many standard data connectors require that they be mated with a corresponding connector in a single, specific orientation. Such connectors can be referred to as polarized connectors. As an example of a polarized connector, FIGS. 2A and 2B depict a micro-USB connector 30, the smallest of the currently available USB connectors. Connector 30 includes a body 32 and a metallic shell 34 that extends from body 32 and can be inserted into a corresponding receptacle connector. As shown in FIGS. 2A, 2B, shell 34 has angled corners 35 formed at one of its bottom plates. Similarly, the receptacle connector (not shown) with which connector 30 mates has an insertion opening with matching angled features that prevents shell 34 from being inserted into the receptacle connector the wrong way. That is, it can only be inserted one way—in an orientation where the angled portions of shell 34 align with the matching angled portions in the receptacle connector. It is sometimes difficult for the user to determine when a polarized connector, such as connector 30 is oriented in the correct insertion position.

Connector 30 also includes an interior cavity 38 within shell 34 along with contacts 36 formed within the cavity. Cavity 38 is prone to collecting and trapping debris within the cavity which may sometimes interfere with the signal connections to contacts 36. Also, and in addition to the orientation issue, even when connector 30 is properly aligned, the insertion and extraction of the connector is not precise, and may have an inconsistent feel. Further, even when the connector is fully inserted, it may have an undesirable degree of wobble that may result in either a faulty connection or breakage.

Many other commonly used data connectors, including standard USB connectors, mini USB connectors, FireWire connectors, as well as many of the proprietary connectors used with common portable media electronics, suffer from some or all of these deficiencies or from similar deficiencies.

BRIEF SUMMARY OF THE INVENTION

Various embodiments of the invention pertain to plug connectors and receptacle connectors that improve upon some or all of the above described deficiencies. Embodiments of the invention are not limited to any particular type of connector and may be used for numerous applications. Some embodiments, however, are particularly well suited for use as audio connectors and some embodiments are particularly well suited for data connectors.

In view of the shortcomings in currently available audio and data connectors as described above, some embodiments of the present invention relate to improved audio and/or data plug connectors that have a reduced plug length and thickness, an intuitive insertion orientation and a smooth, consistent feel when inserted and extracted from its corresponding receptacle connector. Additionally, some embodiments of plug connectors according to the present invention have external contacts instead of internal contacts and do not include a cavity that is prone to collecting and trapping debris.

One embodiment of the invention pertains to a plug connector having a body and a connector tab that extends longitudinally away from the body. The connector tab includes first and second major opposing sides and carries a first plurality of contacts on the first side and a second plurality of contacts on the second side. The first and second plurality of contacts each include the same number of contacts arranged in a substantially identical contact pattern. Further, each contact in the first plurality of contacts is electrically connected to a contact in the second plurality of contacts directly opposite itself. The connector tab has a 180 degree symmetrical shape so that it can be inserted and operatively coupled to a corresponding receptacle connector in either of two insertion orientations.

One particular embodiment of the invention pertains to a plug connector having a substantially flat body. The body can include first and second major opposing sides and third and fourth opposing sides connecting the first and second major sides, the third and fourth sides being substantially thinner than the first and second sides. A plurality of external contacts may be formed on the surface of the substantially flat body near its distal end. The contacts can be symmetrically spaced on one or both of the first and second major opposing sides. In other embodiments, the plurality of contacts are plunger contacts formed inside the body and biased to protrude from a distal end of the body. The plug connector can have a 180 degree symmetrical shape so that it can be inserted and operatively coupled to a corresponding receptacle connector in either of two insertion orientations. In some embodiments, the connector tab includes at least one retention feature, e.g., notches, adapted to engage with a retention feature, e.g., protrusions, on a corresponding receptacle connector. In some further embodiments the plug connector includes one or more ground contacts formed on the side surfaces or the retention features of the plug connector.

In another embodiment, the invention pertains to a plug connector having a body and a tongue extending longitudinally out of body. The tongue includes first and second opposing sides and third and fourth opposing sides connecting the first and second opposing sides. The tongue is further divided about its length into a plurality of sections that are not in electrical contact with one another that serve as contacts. In some embodiments, there are four parallel sections each having a triangular or rectangular cross sections. In other embodiments, the tongue of the plug connector is substantially flat, the third and fourth sides are substantially thinner than the first and second sides, and there are four sections arranged side-by-side each having a generally rectangular cross section. A dielectric material may fill the spaces between the sections. The plug connector can have a 180 degree symmetrical shape so that it can be inserted and operatively coupled to a corresponding receptacle connector in either of two insertion orientations. In some embodiments, the connector tab includes at least one retention feature, e.g., notches, adapted to engage with a retention feature, e.g., protrusions, on a corresponding receptacle connector. In some further embodiments the plug connector includes one or more ground contacts formed on the retention features of the plug connector.

In yet another embodiment, the invention pertains to a plug connector having a plug a substantially flat body with first and second major opposing sides and third and fourth opposing sides connecting the first and second major sides, the third and fourth sides being substantially thinner than the first and second sides. A plurality of contacts and insulation rings are carried by the substantially flat body with a plurality of insulated wires connected to each of the contacts. The plug connector can have a 180 degree symmetrical shape so that it can be inserted and operatively coupled to a corresponding receptacle connector in either of two insertion orientations. In some embodiments, the connector tab includes at least one retention feature, e.g., notches, adapted to engage with a retention feature, e.g., protrusions, on a corresponding receptacle connector. In some further embodiments the plug connector includes one or more ground contacts formed on the retention features or the tip of the plug connector.

In still another embodiment, the invention pertains to a plug connector having a base and a plurality of coaxial protruding contacts with circular cross-sections and extending from the base. The diameters of the cross-sections of the coaxial protruding contacts may be inversely proportional to their distance from the base. An additional protruding coaxial contact may encircle the entirety of each of the plurality of contacts and may serve as a ground contact. In other embodiments, the base may have a plurality of concentric contacts formed on the face of the distal end of the base. An additional protruding contact may extend from the center of the face with a diameter smaller than any diameter of the plurality of concentric contacts and this contact may serve as a ground contact. An annular groove may be formed about the protruding contact to serve as a retention feature.

Other embodiments of the invention pertains to a receptacle connector configured to receive a corresponding plug connector. The receptacle connector includes a housing with an insertion cavity formed within the housing. A plurality of spring contacts extend into the cavity. The receptacle connector further includes a detent having first and second projections, each having a circular cross-section, projecting into the insertion cavity. The first and second projections are designed to engage with notches on a corresponding plug connector to secure the plug connector within the receptacle connector. In some further embodiments the receptacle connector further includes one or more ground contacts formed on its retention features.

In another embodiment, the invention pertains to a receptacle connector configured to receive a corresponding plug connector. The receptacle connector includes a housing with an insertion cavity formed within the housing. A plurality of block contacts may extend into the cavity. There is a groove at the opening of the cavity to make a dovetail, a sliding dovetail, a tapered sliding dovetail or another similar connection with a pin or lip corresponding connector. The groove and corresponding pin or lip serve as retention features, and may further serve as ground contacts.

To better understand the nature and advantages of the present invention, reference should be made to the following description and the accompanying figures. It is to be understood, however, that each of the figures is provided for the purpose of illustration only and is not intended as a definition of the limits of the scope of the present invention.

BRIEF DESCRIPTION OF THE DRAWINGS

FIG. 2A shows a perspective view of a previously known micro-USB plug connector while

FIGS. 3A and 3B are simplified perspective views of plug connector 40 according to embodiments of the present invention;

FIG. 4 is a simplified perspective view of the tab portion 41 of connector 40 shown in FIG. 3 juxtaposed with a receptacle connector adapted to mate with connector 40;

FIGS. 8A-8C are a simplified perspective, front and side views, respectively, of a retention mechanism and a corresponding connector according to other embodiments of the present invention;

FIGS. 9A-9F are a simplified perspective views of connectors according to additional embodiments of the present invention;

DETAILED DESCRIPTION OF THE INVENTION

Figure 1A:
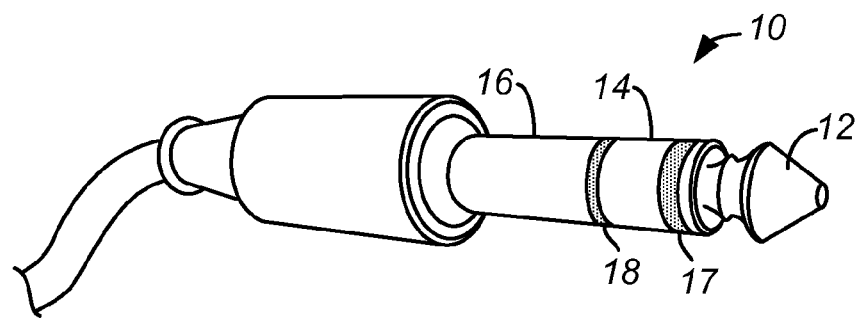
FIGS. 1A and 1B show perspective views of previously known TRS audio plug connectors.
Figure 1B:
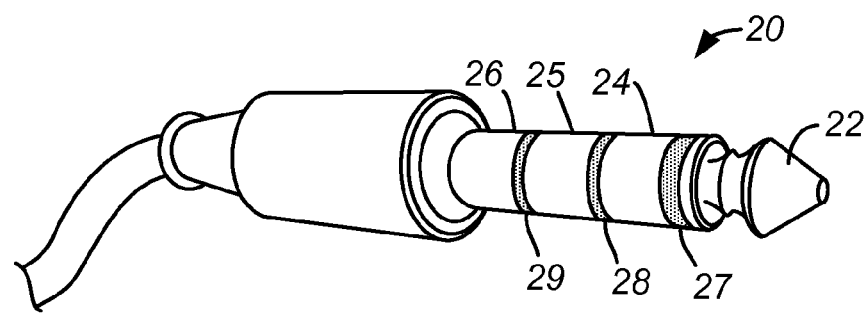
Figure 2A:
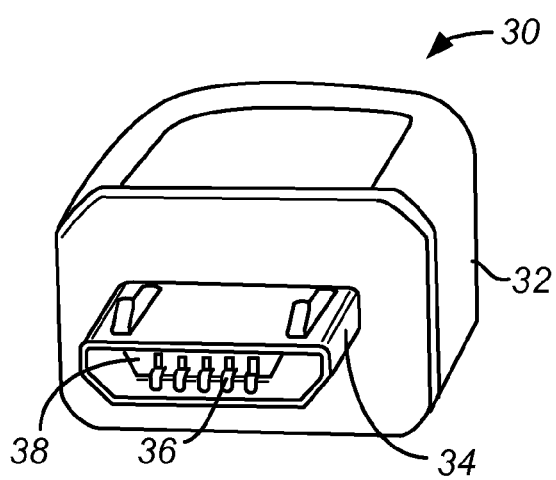
Figure 2B:
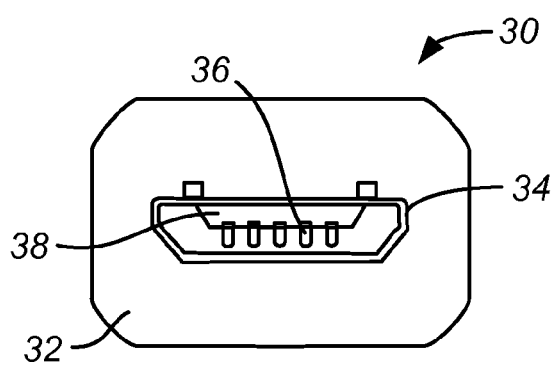
FIG. 2B shows a front plan view of the micro-USB connector shown in FIG. 2A.

Embodiments of the present invention are suitable for a multiplicity of electronic devices, including any device that receives or transmits audio, video or data signals among others. In some instances, embodiments of the invention are particularly well suited for portable electronic media devices because of their potentially small form factor. As used herein, an electronic media device includes any device with at least one electronic component that may be used to present human-perceivable media. Such devices may include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, desktop computers, as well as tablet (e.g., Apple's iPad devices), laptop or other mobile computers. Some of these devices may be configured to provide audio, video or other data or sensory output.

In order to better appreciate and understand the present invention, reference is first made to FIG. 3A which is a simplified perspective view of a first embodiment of a plug connector 40 according to the present invention. As shown in FIG. 3A, connector 40 includes a connector tab 41 extending out of and longitudinally away from a body 45. Connector tab 41 includes four contacts 44a-44d positioned on a front major surface 43a and extend to the distal end of the connector. Connector 40 also includes an opposing back major surface 43b (not visible in FIG. 3) and two side surfaces 43c and 43d, of which only side surface 43c is visible, that are substantially thinner than front and back major surfaces 43a, 43b and extend between the front and back major surfaces. In the embodiment shown in FIG. 3A, connector tab 41 and body 45 have essentially the same width and thickness, but in other embodiments, such as shown in FIG. 3B, a body 48 of the connector can be wider and/or thicker than tab 41.

While connector 40 can be any type of connector and include any reasonable number of contacts, in one particular embodiment, connector 40 is an audio plug connector and contact 44a is a left audio contact, contact 44b is a microphone contact, contact 44c is a ground contact, and contact 44d is a right audio contact. As shown in FIG. 3 contacts 44a-44d are external contacts and connector 40 does not include an exposed cavity in which particles and debris may collect. To improve robustness and reliability, connector 40 may be fully sealed and include no moving parts. Furthermore, connector 40 can have a considerably reduced insertion depth, Z, and insertion width, X, as compared to commonly available TRS and TRRS connectors described above. In one particular embodiment, connector 40 has a width, X, of 2 mm; a thickness, Y, of 1 mm; and an insertion depth, Z, of 4 mm. In another embodiment, tab 41 of connector 40 has a width, X, of 4.1 mm; a thickness, Y, of 1.5 mm; and an insertion depth, Z, of 5.75 mm.

Connector tab 41 can be made from a single piece of high strength non-conductive or insulated material with contacts 44a-44d being deposited directly on the plug. In one embodiment tab 41 is made from a hardened steel core formed by a metal injection molding (MIM) process. An insulator is deposited over the core using, for example, a dielectric physical vapor deposition (PVD) process and then contact traces 44a-44d are deposited using a metal PVD process. In another embodiment, tab 41 is an anodized aluminum core with conductive traces deposited over it using PVD techniques for metal contacts 44a-44d. In still another embodiment, tab 41 is formed from a toughened zirconia core faulted by ceramic injection molding (CIM) techniques and an MIM process is used to form the metal contacts within shallow grooves formed on the surface of the zirconia core.

In other embodiments, tab 41 can be foamed with any of the above cores and contacts 44a-44d can be formed from stamped sheet metal that is placed in matching grooves formed on the upper surface of the core. The sheet metal contacts can be made from a copper, nickel, brass, a metal alloy or any other appropriate conductive material. Also, in some embodiments, an ABS or similar shell 48 is wrapped around a proximal end of connector 40 as shown in FIG. 3B to provide a larger surface area for a user to grip the connector.

While not shown in either of FIG. 3A or 3B, connector 40 can include lead-in features, e.g., a slightly rounded outer surfaces (e.g., as shown by surfaces 43a-43d near the distal end of tab 41) that slopes inward to guide connector tab 41 within cavity 51, that make it easier to insert the connector into a corresponding receptacle connector (shown in FIG. 4) and/or only allow the plug connector to be inserted in the correct orientation. Connector 40 may also include a retention feature (although a retention feature is not shown in FIG. 3, an example of a retention feature is discussed at least below with reference to FIGS. 7A-7C) that cooperates with a corresponding retention feature on a mating receptacle connector to secure the plug connector. In some embodiments, the retention features may also serve as ground contacts.

In some embodiments, connector 40 is designed with 180 degree symmetry (i.e., dual orientation design) so that plug connector 40 can be inserted into a corresponding receptacle connector in both a first orientation where surface 43a is facing up or a second orientation where surface 43a is rotated 180 degrees and facing down. In such embodiments, connector 40 may include an identical number of contacts on each of the major sides 43a and 43b that are also positioned on each side according to the same contact layout (i.e., the contacts on each of sides 43a and 43b are positioned to electrically connect to corresponding contacts in a receptacle connector regardless of which of the two orientations connector 40 is inserted into the receptacle connector). Each contact on the first side is electrically coupled to a corresponding contact on the second side that is positioned directly opposite itself. As an example, the far left contact on side 43a (contact 44a) is electrically connected to the contact on side 43b directly beneath it, which if the connector was flipped over 180 degrees, would be in the same location as contact 44d. Similarly, as another example, contact 44b is electrically connected to the contact directly beneath it, which if the connector was flipped over 180 degrees, would be in the same location as contact 44c. In the embodiments shown in FIGS. 3A and 3B, a direct electrical connection between the contacts on opposing sides is made by wrapping the contacts around the tip of the connector so each contact extends from side 43a, around the distal tip of the connector to side 43b.

To allow for the dual orientation feature of connector 40, tab 41 is not polarized. That is, tab 41 does not include a physical key that is configured to mate with a matching key in a corresponding receptacle connector designed to ensure that mating between the two connectors occurs only in a single orientation. Instead, if tab 41 is divided into top and bottom halves along a horizontal plane that bisects the center of tab 41 along its width, the physical shape of the upper half of tab 41 is substantially the same as the physical shape of the lower half. Similarly, if tab 41 is divided into left and right halves along a vertical plane that bisects the center of tab 41 along its length, the physical shape of the left half of tab 41 is substantially the same as the shape of the right half. Also, in some embodiments additional or separate ground contacts may be formed on the sides or at the distal end of connector tab 41 and can also be arranged in a symmetrical manner.

A sensing circuit in the receptacle or the electronic device in which the receptacle connector is housed can detect the orientation of the contacts and switch internal connections to the contacts in the connector jack as appropriate. For example, a software switch can be used to switch the receptacle jack's contacts for left and right audio depending on the insertion orientation while a hardware switch can be used to switch the connector jacks microphone and ground contacts to match the contacts of connector 40. In other embodiments, both switches can be implemented in software or both switches can be implemented in hardware. The orientation of the connector can be detected by circuitry associated with the corresponding receptacle connector based on signals received over the contacts or based on detecting the position of the ground contact or a power contact. As one example, upon insertion of connector 40 into a receptacle connector, circuitry in the receptacle connector can detect the position of ground contact 44c. Once the position of the ground contact is known, the circuitry can then switch the signaling on the receptacle contacts to match the signals on the plug connector. As another example, upon inserting a connector within a receptacle connector of a host device, the host device may send an Acknowledgment signal to the serial control chip over the contact in the receptacle connector designated for the specific contact and wait for a Response signal. If a Response signal is received, the contacts are aligned properly and audio and/or other signals can be transferred between the connectors. If no response is received, the host device flips the signals in the receptacle connector to correspond to the second possible orientation (i.e., flips the signals 180 degrees) and repeats the Acknowledgement/Response signal routine. In another embodiment, a physical orientation key (e.g., a unique notch or other physical features) formed on the plug connector, can be detected by an orientation contact or other appropriate mechanism in the receptacle connector to determine the orientation of the plug, and a hardware or software switch can set the receptacle connector contacts as appropriate for left and right audio or other data contacts to correspond to the plug connector contacts.

FIG. 4 is a simplified perspective view of tab 41 shown in FIG. 3A juxtaposed with a receptacle connector 50 designed to mate with connector 40. Receptacle jack 50 has a receptacle cavity 51 into which four wire flexure contacts 54a-54d extend. Flexure contacts 54a-54d are wiping contacts that mate with contacts 44a-44d in plug connector 40. Each of the flexure contacts 54a-54d is positioned within respective individual contact cavities 52a-52d. When connector 40 is inserted within cavity 51, upper major surface 43a of connector 40 forces flexure contacts 54a-54d to spring back within their respective contact cavities 52a-52d, whereas contacts 54a-54d are biased to extend within cavity 51 when not subject to an external force. Hence, when connectors 40 and 50 are mated, the bias of contacts 54a-54d causes them to press against contacts 44a-44d, causing contacts 54a-54d to at least partially retract into the contact cavities 52a-52d, and ensures a solid electrical connection between the contacts of connectors 40 and receptacle connector 50 when mated. Because each individual contact on one side of plug connector 40 is electrically coupled to a corresponding contact on the opposing side, receptacle connector 50 can be designed to include a single set of contacts 52a-52d on one side of cavity 51 instead of having contacts formed on both top and bottom interior surfaces within cavity 51. This in turn allows receptacle connector 50 to have a reduced height compared to a similar receptacle connector with separate sets of contacts on opposing interior surfaces as can be appreciated by reference to FIG. 4.

In other embodiments, connector 40 and connector receptacle 50 may each include more than four contacts total or more than four contacts on each of surfaces 43a and 43b, e.g., 6, 8, 10, or more contacts and there may also be ground contacts near the distal tip of connector 40 or on side surfaces 43c and 43d. Where connector 40 is a data plug connector, many different types of digital signals can be carried by four or more contacts including data signals such as, USB signals (including USB 1.0, 2.0 and/or 3.0), FireWire (also referred to as IEEE 1394) signals, SATA signals and/or any other type of data signal. Other digital signals that may be carried by the contacts of connector 40 include signals for digital video such as DVI signals, HDMI signals and Display Port signals, as well as other digital signals that perform functions that enable the detection and identification of devices, electronic media devices or accessories to connector 40.

Figure 5:
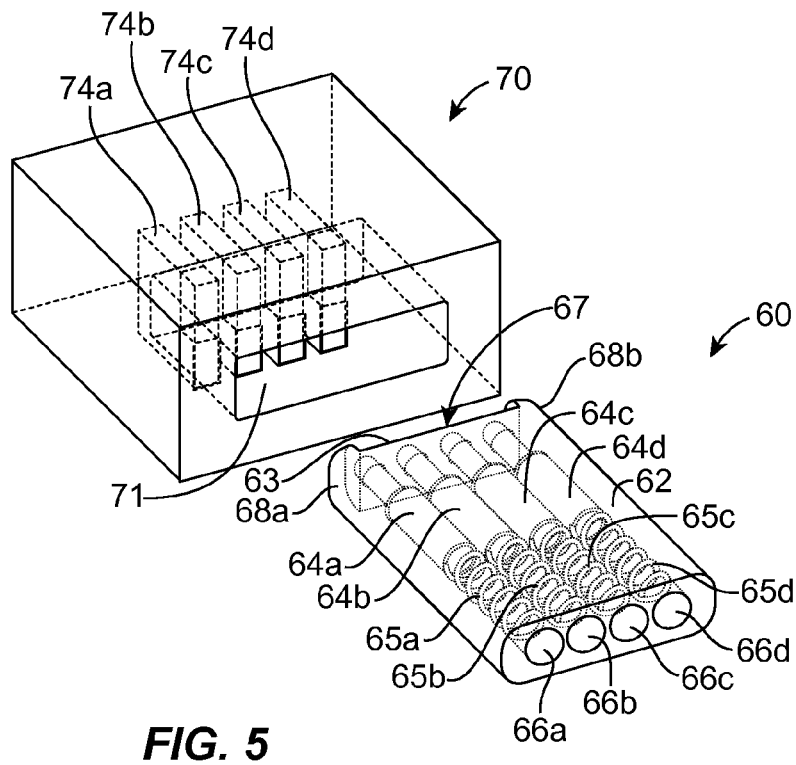
FIG. 5 is a simplified perspective view of the tab portion of a connector according to another embodiment of the present invention juxtaposed with its corresponding receptacle connector.

FIG. 5 is a simplified perspective view of the tab portion of a plug connector 60 according to another embodiment of the present invention juxtaposed with its corresponding receptacle connector 70. Similar to plug connector 40, plug connector 60 may be an audio or data plug connector and may have a 180 degree symmetrical dual orientation design. Plug connector 60 includes plunger pins 64a-64d positioned within an outer shell 62. Shell 62 can be metallic or can be made from a non-conductive or insulative material, such as a ceramic. Behind each plunger pin 64a-64d is a corresponding spring 65a-65d that biases the plunger pins towards distal end 67 of connector 60. As shown in FIG. 5, the distal end 67 of connector 60 includes substantially flat end surface 63 that extends between the upper and lower surfaces of the tab portion of connector 60 and is recessed in the longitudinal direction with respect to sidewalls 68a and 68b. Plunger pins 64a-64d sit in cylindrical cavities 66a-66d formed within the tab portion of connector 60 that terminate at end surface 63.

Receptacle connector 70 includes four block contacts 74a-74d positioned within individual cavities and having a contact surface that extends into a contact insertion cavity 71. When the plug connector is inserted within cavity 71, sidewalls 68a and 68b frame the block contacts 74a-74d which align with plunger contacts 64a-64d. Plunger pins 64a-64d are forced against block contacts 74a-74d during the insertion process and springs 65a-65d retract. The springs 65a-65d, plunger pins 64a-64d and block contacts 74a-74d are designed so that when plug connector 60 is fully inserted within cavity 71, plunger contacts 64a-64d are in electrical contact with their respective block contacts. Plunger pins 64a-64d and block contacts 74a-74d can be used to carry any-appropriate data signal (e.g., the data signals mentioned with reference to connector 40) as well as audio signals, video signals and the like. In some embodiments, there may be more than four plunger pins within connector 60 with corresponding block contacts on receptacle connector 70, e.g., 6, 8, 10, or more plunger pins, and there may also be ground contacts on sidewalls 68a and 68b. As with receptacle connector 50, circuitry associated with receptacle connector 70 can detect the insertion orientation of plug connector 60 and switch the signaling of contacts 74a-74d accordingly.

In one embodiment, plunger contacts 64a-64d are spaced at a pitch of 0.4 mm. Due in part to their small size in this embodiment, the cylindrical cavities 66a-66d that the plunger contacts 64a-64d are positioned within are formed directly in the plug structure rather than in a plug subassembly. A subassembly can be used in other embodiments, however. In one particular embodiment, the body of connector 60 is formed from a toughened zirconia CIM structure and electrical contact to plunge contacts 64a-64d relies on conductivity designed in the housing rather than the spring. In this embodiment, cylindrical cavities 66a-66d are lined with a titanium nitride coating to improve conduction to contacts within the housing.

Connector 60 may include a lead-in feature that allows the connector to be more easily inserted within cavity 71. As one example, sidewalls 68a, 68b may have a slightly rounded outer surface that slopes inward to guide the tab portion of connector 61 within cavity 71. Additionally, and although not shown in the overly simplified FIG. 5, connector 60 may include a retention feature (e.g., the retention features discussed below with reference to FIGS. 7A-7C) that secures plug connector 60 within receptacle connector 70 once it is fully inserted.

Figure 6:
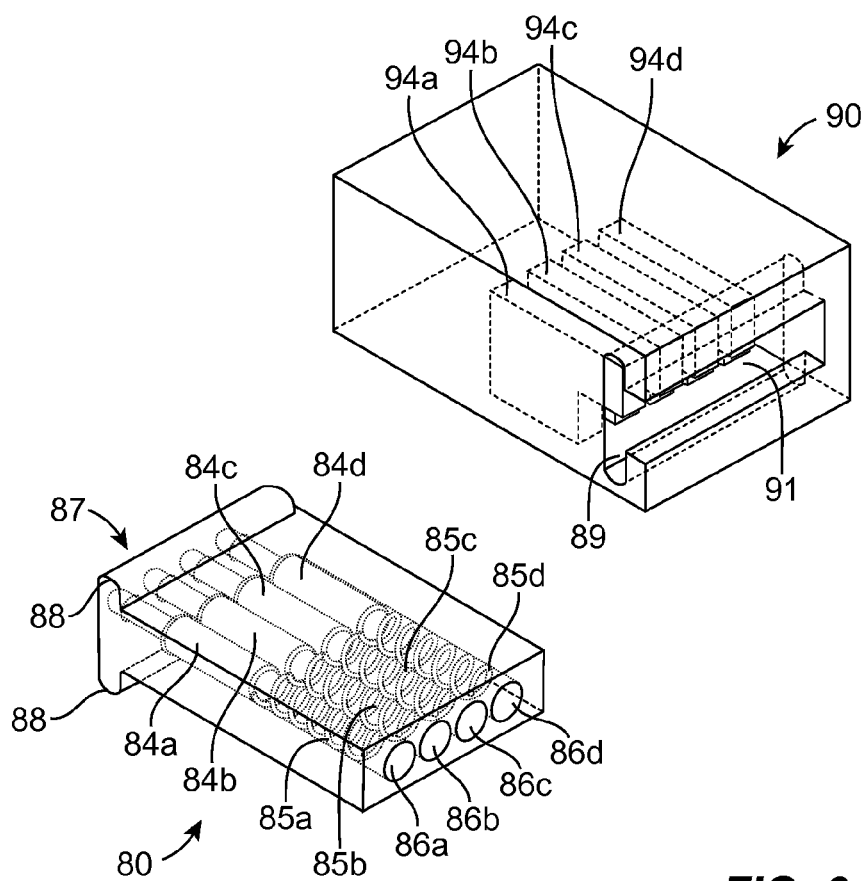
FIG. 6 is a simplified perspective view of the tab portion of a connector according to another embodiment of the present invention juxtaposed with its corresponding receptacle connector.

FIG. 6 is a simplified perspective view of the tab portion of plug connector 80 according to another embodiment of the present invention juxtaposed with its corresponding receptacle connector 90. Plug connector 80 includes plunger pins 84a-84d positioned within cylindrical cavities 86a-86d formed within the tab portion. Behind each plunger pin 84a-84d is a corresponding spring 85a-85d that biases the plunger pins towards distal end 87. Plunger pins 84a-84d, springs 85a-85d and cylindrical cavities 86a-86d are similar to those described above with respect to FIG. 5. Distal end 87 of connector 80 has a pin or lip 88 formed on it that mates with groove 89 of insertion cavity 91 of receptacle connector 90 in an orthogonal sliding dovetail type connection similar to a hot shoe connection used in SLR cameras to connect an external flash or similar component to the camera. In other embodiments, a tapered sliding dovetail connection may also be used with a tapered groove 89 formed on the connector receptacle 90 and corresponding tapered pin or lip 88 formed on connector 80. In additional embodiments, other dovetail connection may be implemented between connector 80 and connector receptacle 90. These dovetail connections may also serve as ground contact connections wherein lip 88 and groove 89 serve as ground contacts for connector 80 and connector receptacle 90, respectively.

Connector receptacle 90 includes four block contacts 94a-94d positioned within individual cavities and having a contact surface that extends into contact insertion cavity 91 similar to that of connector receptacle 70 shown in FIG. 5. The design of connector 80 and corresponding receptacle connector 90 allows wiping of contacts 84a-84d during the connection process even though plunger contacts are used by means of the dovetail connection. Towards this end, block contacts 94a-94d formed within the receptacle connector 90 may include an insertion feature, such as an edge surface that is angled towards the front of insertion cavity 91, which pushes each plunger pin 84a-84d in as the pin is wiped past the particular block contact.

Figure 7A:
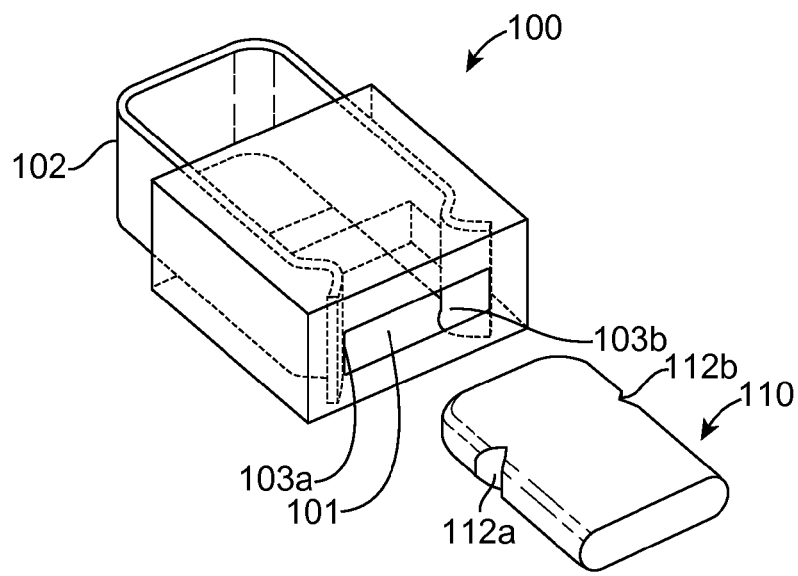
FIGS. 7A-7C are simplified perspective views of retention mechanisms according to embodiments of the present invention.
Figure 7B:
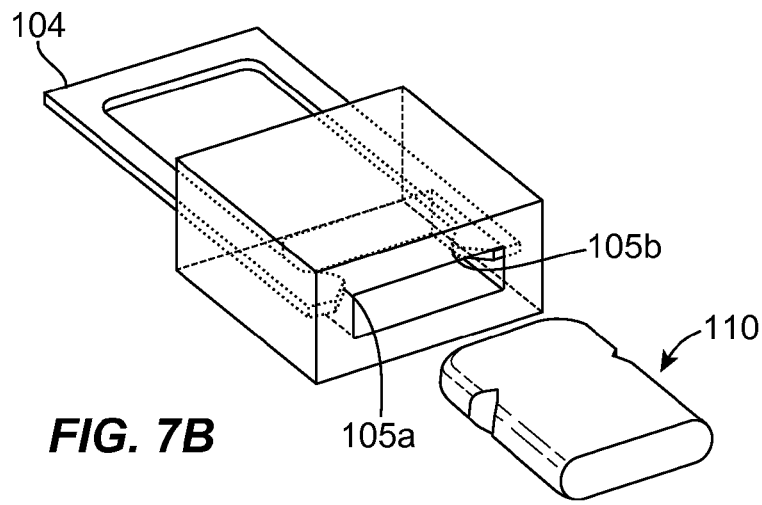
Figure 7C:
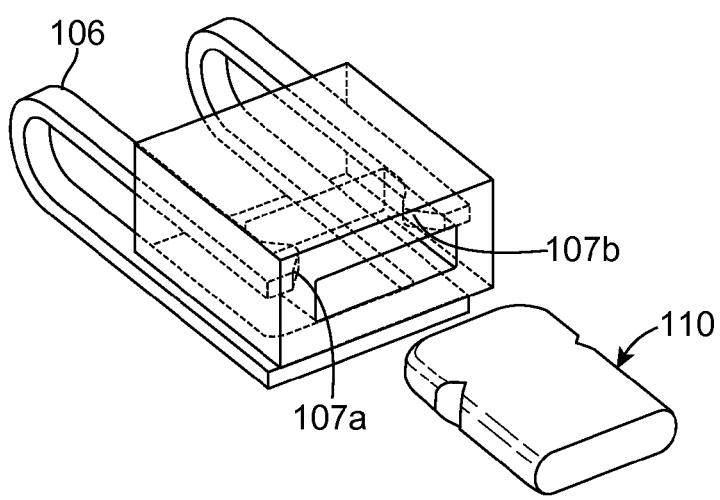

FIGS. 7A-7C are a simplified perspective views of three different bullhorn type detent retention mechanisms according to embodiments of the present invention that can be used to secure plug connectors according to the present invention; such as connectors 40, 60 and others; within their corresponding receptacle connectors. In FIG. 7A a tall bullhorn detent 102 is shown formed within a receptacle connector 100 with a plug connector 110 positioned for insertion into the receptacle connector. Plug connector 110 includes retention features, shown as c-shaped notches 112a, 112b, near its distal end that are positioned to engage with corresponding protruding retention features, shown as c-shaped projections 103a, 103b, of bullhorn detent 102 that extend within an insertion cavity 101 of plug connector 110.

In operation, when plug connector 110 is inserted into cavity 101, protruding retention features 103a, 103b (e.g., c-shaped projections) come in contact with the sidewalls of plug connector 110 and are pressed outward until connector 110 is inserted fully into cavity 101 and protruding retention features 103a, 103b (c-shaped projections) align with notches 112a, 112b at which time they spring inward to latch with the notches. Once latched, in order to disengage plug connector 110 from receptacle connector 100 by pulling connector 110 out of cavity 101, the pull force applied to remove the connector 110 must overcome the spring force applied by detent 102. In addition to holding connector 110 in an engaged position with receptacle connector 100, all or some of retention features 112a, 112b and 103a, 103b may also serve as ground contacts.

FIG. 7B shows a flat bullhorn detent 104 formed within the receptacle connector that includes retention features, shown as flat c-shaped projections 105a and 105b, and FIG. 7C shows a folded bullhorn detent 106 formed within the receptacle connector that includes retention features, shown as flat c-shaped projections 107a, 107b. In some embodiments of the invention, detent travel (i.e., the distance that c-shaped projections 103a, 103b or 105a, 105b or 107a, 107b move laterally) is between about 0.5 mm and about 1.2 mm per side.

FIGS. 8A-8C are a simplified perspective, front and side views, respectively, of an audio or data plug connector 120 and corresponding receptacle connector 130 according to another embodiment of the present invention. Plug connector 120 includes contacts 124a-124d that extend from the upper surface of the connector to its distal end. As shown in FIGS. 8A-8C contacts 124a-124d are external contacts and connector 120 does not include an exposed cavity in which particles and debris may collect. To improve robustness and reliability, connector 120 may be fully sealed and include no moving parts. In some embodiments, contacts 124a-124d wrap around the tip of the connector to be present on both major surfaces and connector 120 has a dual orientation design similar to connector 40 described above. Plug connector 120 also includes indented retention features 123a and 123b, which may have circular cross-sections and be formed on the sidewalls of the connector near its distal end. In the embodiment shown in FIGS. 8A-8C, indented retention features 123a, 123b are conical indents.

Receptacle connector 130 includes flexure contacts 134a-134d that extend into an insertion cavity 131 and spring backward within cavity 131 under force when plug connector 120 is inserted within cavity 131. Receptacle connector 130 also includes a u-shaped retention mechanism 132 that has two protruding retention features 133a, 133b positioned in an opposing relationship to each other. Protruding retention features 133a, 133b have circular cross-sections and are designed to engage with indented retention features 123a, 123b of plug connector 120 when the plug connector mates with the receptacle connector. In the embodiments shown in FIGS. 8A-8C, protruding retention features 133a, 133b are conical tips but they may be spherically shaped in other embodiments. In addition to holding connector 120 in an engaged position with receptacle connector 130, all or some of retention features 123a, 123b and 133a, 133b may also serve as ground contacts.

As shown in FIG. 8C, insertion cavity 131 has an opening along its width that is considerably wider than the thickness of plug connector 120. The extra width in the opening of cavity 131, combined with the manner in which protruding retention features 133a, 133b mate with indented retention features 123a, 123b allows plug connector 120 to pivot around the protruding retention features 133a, 133b so that connectors 120, 130 are less likely to break when subject to lateral forces applied to the front or back of connector 120, e.g., force applied in direction 138a or 138b. When plug connector 120 is mated with receptacle connector 130, contacts 134a-134d are spring biased towards the plug connector 120 so that an electrical connection between contacts 134a-134d and corresponding contacts 124a-124d is maintained while the plug connector pivots.

In operation, when plug connector 120 is inserted into cavity 131, protruding retention features 133a, 133b come in contact with the sidewalls of the plug connector and are pressed outward until connector 120 is inserted fully into cavity 131 and protruding retention features 133a, 133b align with and latch into indented retention features 123a, 123b. Once latched, in order to disengage plug connector 120 from receptacle connector 130 by pulling connector 120 out of cavity 131, the pull force applied to remove connector 120 must overcome the spring force applied by retention mechanism 132. Connector 120 can also be removed from receptacle 130 by pressing laterally on connector 120 in either direction 138a or 138b. Movement of plug connector 120 in either direction 138a or 138b back drives protruding retention features 133a, 133b (e.g., conical projections) allowing plug connector 120 to resist breakage and disengage from the receptacle connector.

In some embodiments, contacts 124a-124d and flexure contacts 134a-134d can be used to carry any appropriate data signal (e.g., the data signals mentioned with reference to connector 40) as well as audio signals, video signals and the like. In some embodiments, there may be more than four contacts on connector 120 with corresponding flexure contacts on connector receptacle 130, e.g., 6, 8, 10, or more contacts, and there may also be ground contacts in the retention features as discussed with reference to previous embodiments.

FIGS. 9A-9F are a simplified perspective views of audio or data plug connectors according to additional embodiments of the present invention that can also have 180 degree dual orientation design. Each of the connectors shown in FIGS. 9A-9F include four contacts arranged in various ways. For example, connector 140 shown in FIG. 9A has four contacts arranged on four different outer surfaces of a connector tab or tongue 141 (only two contacts are visible). As shown in FIG. 9A, connector 140 may also includes retention features. These retention features may function in a manner similar to the retention features discussed with reference to the aforementioned connectors 110 and 120, including the ability to also serve as ground contacts. Plug connector 145 shown in FIG. 9B has four contacts 146a-146d projecting out from a base in a quadrant arrangement where each of the contacts is physically spaced apart and separated from the others. In FIG. 9C, a connector 150 is shown that employs a similar quadrant type arrangement of four connectors 151a-151d but separates the connectors with a plastic or similar dielectric material 152 to make a single robust plug as opposed to individual pins.

In FIG. 9D four pins 156a-156d are spaced apart laterally along the width of a plug connector 155 and a plastic or similar dielectric material 152 is formed between the pins to make a single robust plug. FIGS. 9E and 9F show plug connectors 160 and 165 that are similar to plug connectors 145 and 150, respectively, except that the cross-sectional shape of the connector pins or contacts are rectangular rather than triangular. In some embodiments, the contacts shown in the connectors of FIGS. 9A-9F, as well as with other connectors according to the present invention, are made from a conductive elastomer that provides compliance for connection while the dielectric material 152 between the pins is made from a high strength insulator. In other embodiments, the connector pins of the connector of FIGS. 9A-9F are made from a dielectric material coated with a conductive layer.

The contacts of connectors 140, 145, 150, 155, 160 and 165 can be used to carry any appropriate data signal (e.g., the data signals mentioned with reference to connector 40) as well as audio signals, video signals and the like. In some embodiments, there may be more than four contacts on connectors 140, 145, 150, 155, 160 and 165 with corresponding contacts on a corresponding connector receptacle, e.g., 6, 8, 10, or more contacts, and there may also be ground contacts near the distal tip or on the sidewalls of these connectors. Also, FIG. 9A-9F show that at least the contacts of connectors 140, 152, 155, and 160 are external contacts and these connectors do not include an exposed cavity in which particles and debris may collect. To improve robustness and reliability, connectors 140, 152, 155, and 160 may be fully sealed and include no moving parts.

Figure 10A:
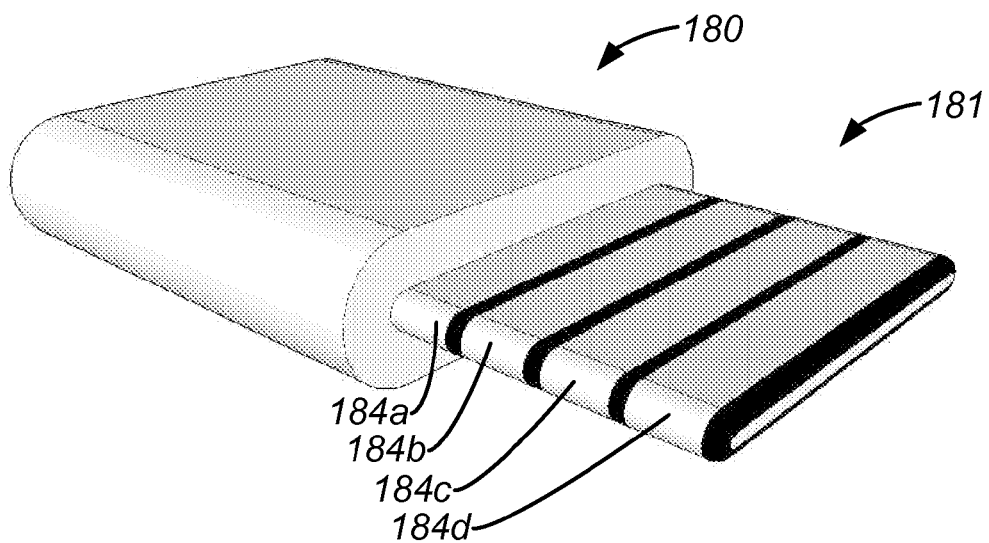
FIGS. 10A-10C are a simplified perspective and side views of a connector according to yet another embodiment of the present invention.
Figure 10B:
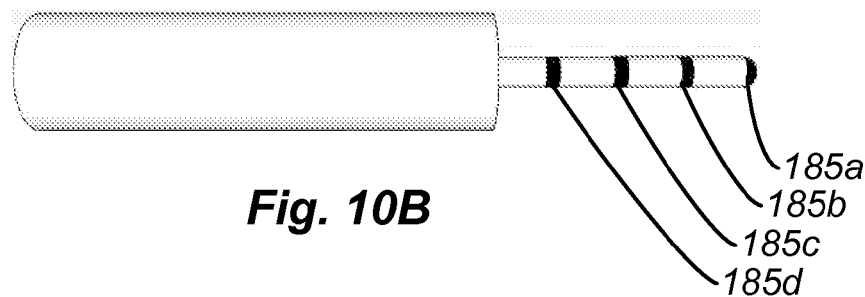
Figure 10C:
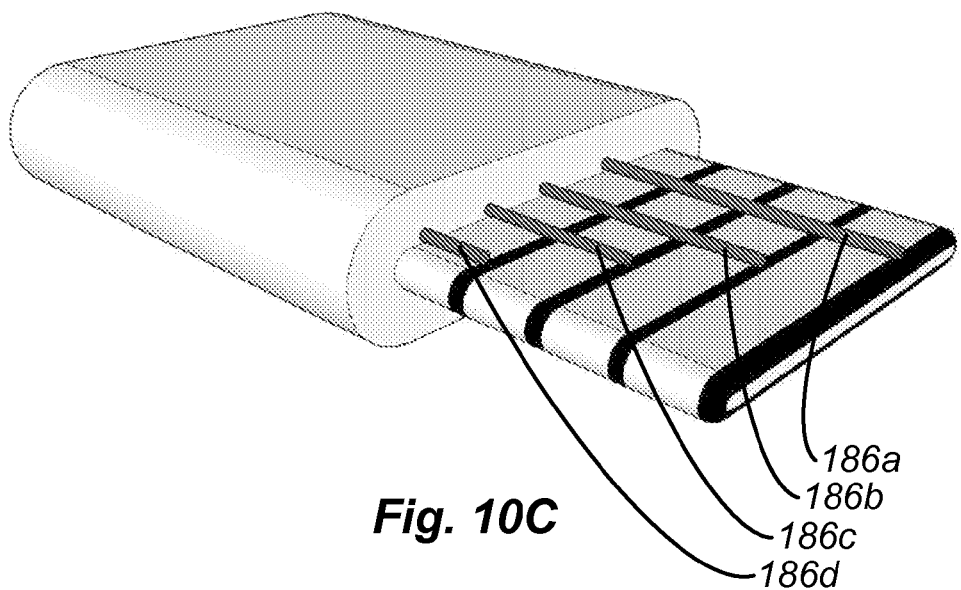

FIGS. 10A-10B are simplified perspective and side views of an audio or data plug connector 180 according to yet another embodiment of the present invention that also has a 180 degree dual insertion orientation design. Connector 180 has a substantially flat tab 181 that carries four sleeve contacts 184a-184d that encircle tab 181 and are electrically isolated from each other by insulation rings 185a-185d. As shown illustratively in FIG. 10C, four insulated wires 186a-186d run side-by-side within tab 181 and are joined to their respective contacts 184a-184d at an internal contact point in a section of the tip corresponding to the particular contact. As shown in FIGS. 10A-10C, contacts 184a-184d are external contacts and connector 180 does not include an exposed cavity in which particles and debris may collect. To improve robustness and reliability, connector 180 may be fully sealed and include no moving parts.

The contacts of connectors 180 can be used to carry any appropriate data signal (e.g., the data signals mentioned with reference to connector 40) as well as audio signals, video signals and the like. In some embodiments, there may be more than four sleeve contacts on connector 180, e.g., 6, 8, 10, or more contacts, and there may also be ground contacts near the distal tip or on the sidewalls of connector 180.

Figure 11A:
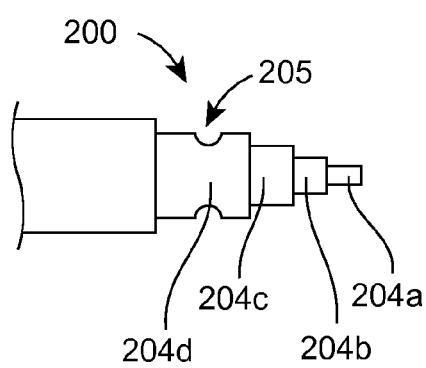
FIGS. 11A-11D are simplified side, side, front and perspective views, respectively, of plug connectors according to other embodiments of the present invention.

In other embodiments of the invention, an audio or data coaxial connector can be employed that does not require axial spacers (e.g., insulation rings 185a-185d shown in FIGS. 10A-10C) and thus enables a reduced length connector. FIG. 11A is a simplified side view of one such connector 200 according to one embodiment of the present invention. Connector 200 includes four contacts 204a-204d that decrease in diameter from contact 204a at the distal end of the connector to contact 204d at its base. A retention feature 205, shown as an annular groove, formed around connector 204d acts as part of a retention mechanism when connector 200 is inserted into a corresponding receptacle connector having a detent or similar retention feature positioned to align with retention feature 205.

Figure 11B:
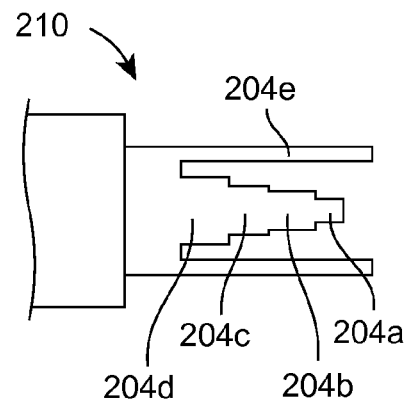
Figure 11C:
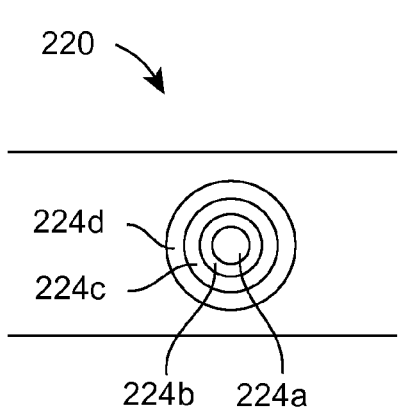
Figure 11D:
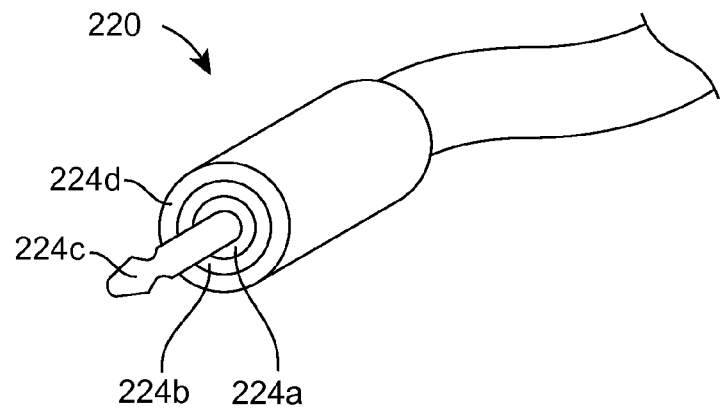

FIG. 11B is a simplified side view of connector 210 according to another embodiment. Connector 210 has contacts 204a-204d similar to those of connector 200 and further includes a ground contact 204e that encircles the entirety of each of contacts 204a-204d. In another embodiment, a connector 220 includes multiple contacts formed on the face of concentric sleeves as shown in FIGS. 11C and 11D. Specifically, connector 220 includes a center contact 224a that is surrounded by three concentric rings 224b-224d of increasing diameter. Each ring 224b-224d includes contacts formed on its interior surface that mate with contacts formed on an exterior surface of matching concentric rings in a receptacle connector. The design of center contact 224a may be similar to standard TRS and TRRS connectors mentioned previously, including a bulbous head retention feature and, in some embodiments, additional ring contacts formed about its length. In other embodiments, the surface area of the cross section of center contact 224a may be much smaller than that of standard TRS and TRRS connectors.

The contacts of connectors 200, 210 and 220 can be used to carry any appropriate data signal (e.g., the data signals mentioned with reference to connector 40) as well as audio signals, video signals and the like. In some embodiments, there may be more than the four contacts shown in FIGS. 11A-11B (204a-204d and 224a-224d) carried by connectors 200, 210 and 220, e.g., 6, 8, 10, or more contacts.

Some embodiments of the present invention are described using claims:

1. A plug connector comprising:
a body;
a tongue extending longitudinally away from the body, the tongue having first and second opposing sides and third and fourth opposing sides connecting the first and second sides;
retention features formed on the third and fourth sides near a distal end of the tongue; and
at least one contact carried by the tongue on each of the first, second, third and fourth sides;
wherein the tongue is shaped and the contacts are arranged to have 180 degree symmetry so that the plug connector can be inserted and operatively coupled to a corresponding receptacle connector in either of two orientations.

2. The plug connector set forth in claim 1 wherein the retention features are notches.

3. The plug connector set forth in claim 2 wherein the notches are v-shaped indentations.

4. A plug connector comprising:
a body;
a tongue extending longitudinally away from the body, the tongue being divided about its length into a plurality of sections that are not in electrical contact with one another, each of the plurality of sections including at least one contact; and
wherein the tongue is shaped and the contacts are arranged to have 180 degree symmetry so that the plug connector can be inserted and operatively coupled to a corresponding receptacle connector in either of two orientations.

5. The plug connector set forth in claim 4 wherein the tongue includes four sections each having a triangular cross section arranged to provide the tongue with a generally rectangular cross section.

6. The plug connector set forth in claim 4 wherein the tongue includes four sections, arranged in a two-by-two matrix pattern.

7. The plug connector set forth in claim 6 wherein the tongue is substantially flat.

8. The plug connector set forth in claim 7 wherein the tongue includes four sections, each having a generally rectangular cross section, arranged side-by-side.

9. The plug connector set forth in claim 4 wherein a dielectric material fills spaces between the plurality of sections.

10. A plug connector comprising:
a substantially flat body having first and second major opposing sides and third and fourth opposing sides connecting the first and second major sides, the third and fourth sides being substantially thinner than the first and second sides;
a plurality of contacts carried by the substantially flat body;
a plurality of insulation rings separating each of the contacts; and
a plurality of insulated wires connected to each of the contacts.

11. A plug connector comprising:
a base,
a plurality of coaxial protruding contacts having circular cross-sections and extending from the base, wherein the diameters of the cross-sections of the coaxial protruding contacts are inversely proportional to their distance from the base.

12. The plug connector set forth in claim 11 wherein an annular groove is formed about the protruding contact with the largest diameter cross-section.

13. The plug connector set forth in claim 11 wherein an additional coaxial protruding contact with a circular cross-section protrudes from the base and extends a length about equal to the length of the protruding contact that extends furthest from the base, wherein the additional coaxial protrusion contact is hollow having a first outer diameter and a second inner diameter, wherein the second inner diameter is greater than the diameter of any of the cross sections of the plurality of coaxial protruding contacts.

14. The plug connector set forth in claim 13 wherein the additional coaxial protruding contact is a ground contact.

15. A plug connector comprising:
a base,
a plurality of concentric contacts formed on a face of a distal end of the base,
a protruding contact extending from a center of the face having a circular cross section with a diameter smaller than any diameter of the plurality of concentric contacts.

16. The plug connector set forth in claim 15 wherein an annular groove is formed about the protruding contact.

17. A receptacle connector configured to receive a corresponding plug connector, the receptacle connector comprising:
a housing;
an insertion cavity formed within the housing, the insertion cavity having first and second opposing interior surfaces;
a plurality of contacts that extend into the cavity from the first interior surface and no contacts on the second interior surface;
circuitry adapted to detect an insertion orientation of a plug connector in conjunction with a mating event and switch signals on the plurality of contacts to match the signal on the plug connector based on the insertion orientation of the plug connector.

18. A receptacle connector configured to receive a corresponding plug connector, the receptacle connector comprising:

a housing;
an insertion cavity formed within the housing;
a plurality of block contacts that extend into the cavity;
a groove at an opening of the cavity.

19. The receptacle connector of claim 18 wherein the groove is a sliding dovetail groove.

As will be understood by those skilled in the art, the present invention may be embodied in other specific forms without departing from the essential characteristics thereof. For example, while embodiments of the invention were mostly discussed above with respect to audio plugs having four contacts, the invention is not limited to any particular number of contacts. Some embodiments of the invention may have as few as two contacts while other embodiments can have thirty or even more contacts. As another example, all the embodiments of the invention described herein having contacts on a single side of the connector can be modified to have contacts on at least opposing sides of the connector. In many of these embodiments, the contacts can be arranged to have 180 degree symmetry so that the connector can be inserted into a receptacle connector in either of two different orientations.

Additionally, while the invention was described with respect to an audio connector in some cases, it is not limited to any particular type of signal and can be used to carry video and/or other signals instead of audio-related signals or in addition to audio-related signals. Also, in some embodiments, connectors according to the present invention can carry both analog and digital signals. As an example, connectors according to the present invention can be modified to include one or more fiber optic cables that extend through the connector and can be operatively coupled to receive or transmit optical signals between a mating connector jack. Fiber optic cables allow for high data rate transmissions and can be used for USB 4.0 compatibility (e.g., 10 GB/second data transfer). Connectors according to the present invention may include power, audio and data connections and can be used to charge a device while simultaneously providing data and audio functions. Those skilled in the art will recognize, or be able to ascertain using no more than routine experimentation, many equivalents to the specific embodiments of the invention described herein. Such equivalents are intended to be encompassed by the following claims.

What is claimed is:

1. A plug connector comprising:
a body;
a tab connected to and extending longitudinally away from the body, the tab including first and second opposing sides; and
a first plurality of contacts carried by the tab on the first side and a second plurality of contacts carried by the tab on the second side, wherein each individual contact in the first plurality of contacts is positioned directly opposite of and electrically connected to a corresponding contact in the second plurality of contacts;
wherein the tab is shaped and the first and second plurality of contacts are arranged to have 180 degree symmetry so that the plug connector can be inserted and operatively coupled to a corresponding receptacle connector in either of two orientations.

2. The plug connector set forth in claim 1 wherein each contact in the first plurality of contacts wraps around a distal tip of the tab to a corresponding contact in the second plurality of contacts.

3. The plug connector set forth in claim 1 wherein the tab further includes third and fourth sides that extend between the first and second sides, the third and fourth sides being relatively thin compared to the first and second sides.

4. The plug connector set forth in claim 3 further comprising retention features formed on the third and fourth sides near a distal end of the connector.

5. The plug connector set forth in claim 4 wherein the retention features comprise ground contacts.

6. The plug connector set forth in claim 4 wherein the retention features have a conical shape that extends into the tab perpendicular to the third and fourth sides.

7. A plug connector comprising:
a substantially flat body having first and second major opposing sides and third and fourth opposing sides connecting the first and second major sides, the third and fourth sides being substantially thinner than the first and second sides; and
a plurality of contacts carried by the substantially flat body at its distal end;
wherein the distal end of the body is shaped to have 180 degree symmetry so that it can be inserted and operatively coupled to a corresponding receptacle connector in either of two orientations;
wherein the substantially flat body comprises a metal core covered with an insulator and the plurality of contacts are deposited over the insulator.

8. A plug connector comprising:
a substantially flat body having first and second major opposing sides and third and fourth opposing sides connecting the first and second major sides, the third and fourth sides being substantially thinner than the first and second sides; and
a plurality of contacts carried by the substantially flat body at its distal end;
wherein the distal end of the body is shaped to have 180 degree symmetry so that it can be inserted and operatively coupled to a corresponding receptacle connector in either of two orientations;
wherein the substantially flat body comprises a ceramic core formed by ceramic injection molding and the plurality of contacts are formed on the ceramic core with a metal injection molding process.

9. A plug connector comprising:
a substantially flat body having first and second major opposing sides and third and fourth opposing sides connecting the first and second major sides, the third and fourth sides being substantially thinner than the first and second sides; and
a plurality of contacts carried by the substantially flat body at its distal end;
wherein the distal end of the body is shaped to have 180 degree symmetry so that it can be inserted and operatively coupled to a corresponding receptacle connector in either of two orientations;
wherein the substantially flat body comprises an anodized aluminum core and the plurality of contacts are deposited directly over the anodized aluminum core.

10. The plug connector set forth in claim 7 wherein the plurality of contacts comprise left and right audio contacts and a microphone contact.

11. The plug connector set forth in claim 10 wherein the plurality of contacts further comprises a ground contact.

12. The plug connector set forth in claim 7 wherein the plug connector further comprises retention features formed on the third and fourth sides near a distal end of the connector.

13. A plug connector comprising:
a substantially flat body having first and second major opposing sides and third and fourth opposing sides connecting the first and second major sides, the third and fourth sides being substantially thinner than the first and second sides; and
a plurality of contacts carried by the substantially flat body at its distal end;
wherein the distal end of the body is shaped to have 180 degree symmetry so that it can be inserted and operatively coupled to a corresponding receptacle connector in either of two orientations;
wherein the plurality of contacts comprise plunger contacts set inside and biased to protrude from the distal end of the substantially flat body.

14. The plug connector set forth in claim 13 wherein the plunger contacts protrude from a substantially flat end surface on the distal end of the body that extends between the first and second opposing major sides and is recessed along a longitudinal axis of the plug connector with respect to the third and fourth surfaces.

15. The plug connector set forth in claim 13 wherein each of the plunger contacts resides within a cylindrical cavity lined with a conductive metal.

16. The plug connector set forth in claim 13 wherein the plug connector further comprises notches formed on the third and fourth sides near the distal end of the connector.

17. The plug connector set forth in claim 13 wherein the distal end comprises a lip for mating with a corresponding receptacle connector comprising a groove.

18. A receptacle connector configured to receive a corresponding plug connector, the receptacle connector comprising:
a housing;
an insertion cavity formed within the housing, the insertion cavity having first and second opposing interior surfaces;
a plurality of contacts that extend into the cavity from the first interior surface and no contacts on the second interior surface; and
circuitry adapted to detect an insertion orientation of a plug connector in conjunction with a mating event and switch signals on the plurality of contacts to match the signal on the plug connector based on the insertion orientation of the plug connector.

19. The receptacle connector set forth in claim 18 further comprising a detent having first and second projections, each having a circular cross-section, projecting into the insertion cavity, the first and second projections designed to engage with notches on a corresponding plug connector to secure the plug connector within the receptacle connector; wherein the plurality of contacts are spring contacts.

20. The receptacle connector of claim 19 wherein the projections are conical shaped projections.

21. The receptacle connector of claim 20 wherein the detent comprises a U-shaped frame and the first and second projections are formed on opposing ends of the frame.

22. The receptacle connector of claim 19 wherein the plurality of spring contacts are biased to extend into the cavity and the detent is not included.

23. The receptacle connector of claim 19 wherein the plurality of spring contacts are not included.

24. The receptacle connector of claim 19 wherein the first and second projections are ground contacts.

* * * * *